(12) United States Patent
Lee et al.

(10) Patent No.: US 7,238,626 B2
(45) Date of Patent: Jul. 3, 2007

(54) CHEMICALLY AND ELECTRICALLY STABILIZED POLYMER FILMS

(75) Inventors: Chung J. Lee, Fremont, CA (US); Atul Kumar, Santa Clara, CA (US)

(73) Assignee: Dielectric Systems, Inc., Fremont, CA (US)

(*) Notice: Subject to any disclaimer, the term of this patent is extended or adjusted under 35 U.S.C. 154(b) by 254 days.

(21) Appl. No.: 11/020,422

(22) Filed: Dec. 21, 2004

(65) Prior Publication Data

US 2005/0221626 A1    Oct. 6, 2005

Related U.S. Application Data

(63) Continuation-in-part of application No. 10/116,724, filed on Apr. 4, 2002, now Pat. No. 6,881,447.

(51) Int. Cl.
*H01L 21/31* (2006.01)

(52) U.S. Cl. .................. 438/778; 438/622; 438/623; 438/624; 438/627; 438/643; 438/644; 257/767; 257/751; 257/E21.261; 257/E21.264

(58) Field of Classification Search .................. None
See application file for complete search history.

(56) References Cited

U.S. PATENT DOCUMENTS

| | | | | |
|---|---|---|---|---|
| 6,066,516 A | * | 5/2000 | Miyasaka | 438/149 |
| 6,140,456 A | * | 10/2000 | Lee et al. | 528/196 |
| 6,358,863 B1 | * | 3/2002 | Desu et al. | 438/763 |

* cited by examiner

*Primary Examiner*—Michael Lebentritt
*Assistant Examiner*—Kyoung Lee
(74) *Attorney, Agent, or Firm*—Allerman Hall McCoy Russell & Tuttle LLP

(57) ABSTRACT

A method of stabilizing a poly(paraxylylene) dielectric thin film after forming the dielectric thin film via transport polymerization is disclosed, wherein the method includes annealing the dielectric thin film under at least one of a reductive atmosphere and a vacuum at a temperature above a reversible solid phase transition temperature of the dielectric film to convert the film from a lower temperature phase to a higher temperature phase, and cooling the dielectric thin film at a sufficient rate to a temperature below the solid phase transition temperature of the dielectric thin film to trap substantial portions of the film in the higher temperature phase.

20 Claims, 1 Drawing Sheet

CHEMICALLY AND ELECTRICALLY STABILIZED POLYMER FILMS

CROSS-REFERENCE TO RELATED APPLICATION

This application is a continuation-in-part of U.S. patent application Ser. No. 10/116,724, filed Apr. 4, 2002 now U.S. Pat. No. 6,881,447, the entire disclosure of which is hereby incorporated by reference.

BACKGROUND

The present disclosure relates to stabilization methods for making polymer dielectric that is useful in the manufacturing of future integrated circuits ("IC's"). The present disclosure relates to, in particular, stabilization methods for making a polymer film to achieve its best electrical performance after film deposition. In addition, it relates to post treatment methods to retain the chemical integrity on film surface during and after exposure to chemical processes, especially after reactive plasma etching of the dielectric that employed during the fabrication of IC's. The post treatment method will assure good adhesion and film integrity to a subsequent top layer film.

During the manufacturing of IC's, multiple layers of films are deposited. Maintaining the compatibility and structural integrity of the different layers throughout the processes involved in finishing the IC is of vital importance. In addition to dielectric and conducting layers, its "barrier layer" may include metals such as Ti, Ta, W, and Co and their nitrides and silicides, such as TiN, TaN, $TaSi_xN_y$, $TiSi_xN_y$, $WN_x$, $CoN_x$ and $CoSiN_x$. Ta is currently the most useful barrier layer material for the fabrication of future IC's that use copper as conductor. The "cap layer or etch stop layer" normally consists of dielectric materials such as SiC, SiN, SiON, silicon oxide ("$Si_yO_x$"), fluorinated silicon oxide ("FSG"), SiCOH, and SiCH.

The schematic in FIG. 1 is used to illustrate some fundamental processes involved for fabrication of a single Damascene structure and future IC's. During fabrication of future ICs, first a dielectric 110 is deposited on wafer using a Spin-On or Chemical Vapor Deposition ("CVD") dielectric. Then, a photoresist is spun onto the substrate and patterned using a photo mask and UV irradiation. After removal of unexposed photoresist and form a pattern of cured photoresist over the underlying dielectric, a via in the dielectric layer is formed by plasma etching of the dielectric that is not protected by the photoresist. Then, a thin layer (100 to 200 Å) of barrier metal 130 such as Ta is deposited using physical vapor deposition ("PVD") method. This is followed by deposition of a very thin (50 to 100 Å) layer of copper seed 150 using PVD or Metal-Organic CVD ("MOCVD"). After that, the via is filled with copper 140 by ECP ("Electro-Chemical Plating") method. After the copper is deposited, Chemical Mechanical Polishing ("CMP") may be needed to level the surface of the Damascene structure. Optionally, a cap-layer is deposited over the dielectric before coating of photoresist and photolithographic pattering of the dielectric. The cap-layer can be used to protect the dielectric from mechanical damage during CMP.

In our U.S. Pat. No. 6,825,303, transport polymerization ("TP") methods and processes for making low dielectric polymers that consist of $sp^2C$—X and $HC$-$sp^3C_\alpha$—X bonds were revealed. Wherein, X is H or preferably F for achieving better thermal stability and lower dielectric constant of the resulting polymers. $HC$-$sp^3C_\alpha$—X is designated for a hyper-conjugated $sp^3C$—X bond or for a single bond of X to a carbon atom that is bonded directly to an aromatic moiety. Due to hyper-conjugation (see p. 275, T. A. Geissman, "Principles of Organic Chemistry," $3^{rd}$ edition, W. H. Freeman & Company), this C—X (X=H or F) has some double-double bond character, thus they are thermally stable for fabrications of future ICs.

However, we have observed that after transport polymerization, an as-deposited thin film may not achieve its best dimensional and chemical stability. Therefore, in the U.S. Pat. No. 6,703,462, deposition conditions and post treatment methods to achieve high dimensional stability from the as-deposited films are described.

In this application, methods to optimize the chemical stability thus achieving best electrical performance for an as-deposited film are described. In addition, after reactive plasma etching of a dimensionally and chemically stabilized film, the surface chemical composition of the resulting film has changed. Due to degradation of surface composition under reactive conditions, loss of adhesion between dielectric film and barrier metal, cap layer or etch-stop layer can occur. Therefore, processing conditions are disclosed to provide good chemical stability thus interfacial adhesion between the dielectric film and the subsequently deposited top layer such as the barrier metal, the cap layer or etch-stop layer.

SUMMARY

One embodiment provides a method of stabilizing a poly(paraxylylene) dielectric thin film after forming the dielectric thin film via transport polymerization, wherein the method includes annealing the dielectric thin film under at least one of a reductive atmosphere and a vacuum at a temperature above a reversible solid phase transition temperature of the dielectric film to convert the film from a lower temperature phase to a higher temperature phase, and cooling the dielectric thin film at a sufficient rate to a temperature below the solid phase transition temperature of the dielectric thin film to trap substantial portions of the film in the higher temperature phase.

DETAILED DESCRIPTION OF THE PREFERRED EMBODIMENTS

Figure 1:
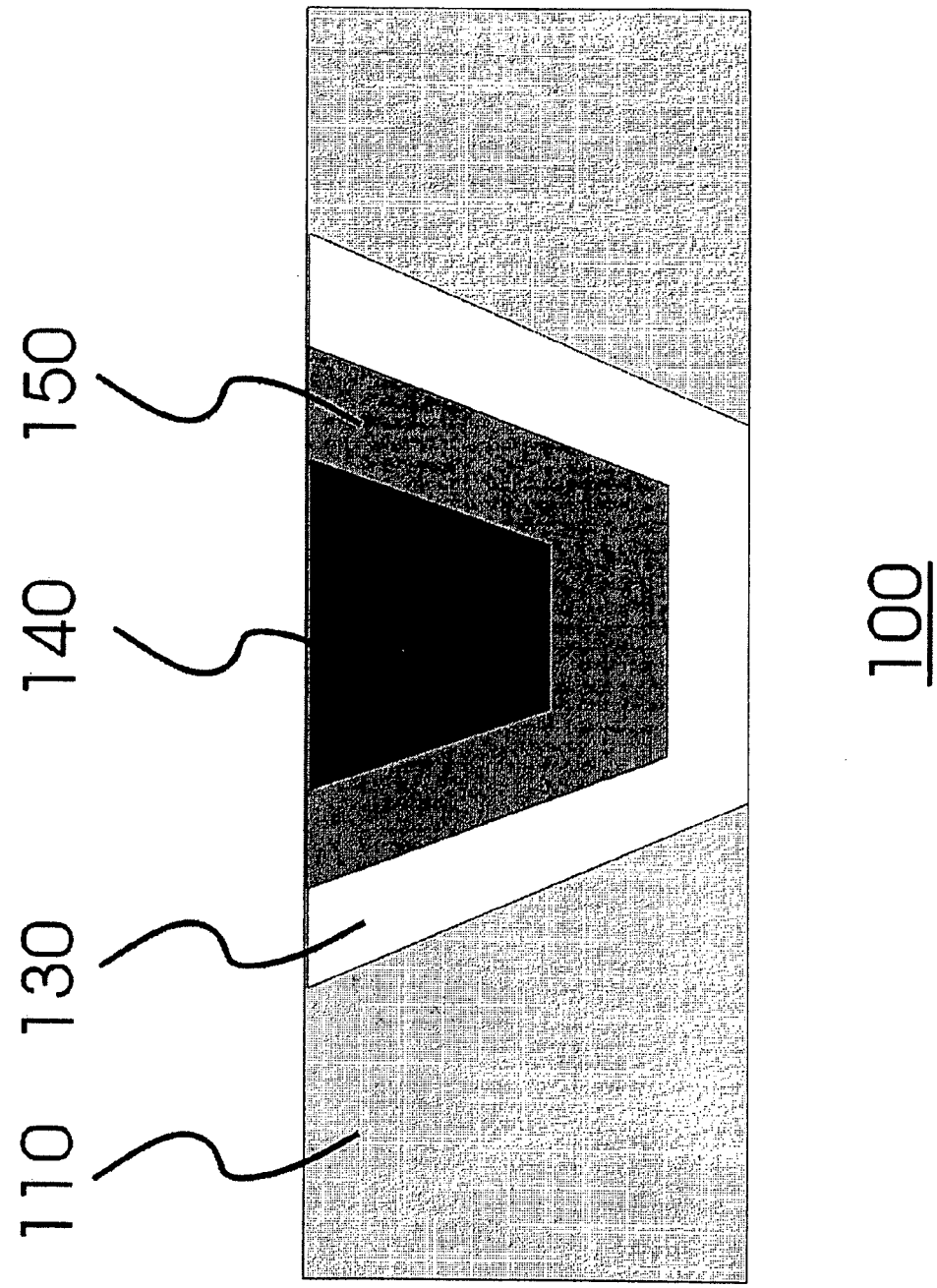
FIG. 1 illustrates a single Damascene structure.

Broadly, the present disclosure pertains to processing method of polymer films that consist of consist of $sp^2C$—X and $HC$-$sp^3C$—X bonds (X=H or F) for fabrications of future IC's. The present disclosure also pertains to processing methods of polymers that consist of consist of $sp^2C$—X and $HC$-$sp^3C^\alpha$—X bonds (X=H, F) and exhibit at least an irreversible crystal transformation temperature ("$T_1$"), a reversible crystal transformation temperature ("$T_2$") and a crystal melting temperature, ("$T_m$"). The present disclosure furthermore pertains to annealing methods to stabilize an as-deposited film that prepared from Transport Polymerization. The present disclosure, in addition, pertains to annealing methods to stabilize the polymer films after a reactive plasma etching. Furthermore, the present disclosure pertains to employment of reductive plasma conditions for patterning polymer films that consist of $sp^2C$—X and $HC$-$sp^3C_\alpha$—X bonds (X=H, F).

I. General Chemical Aspects:

The polymer films disclosed herein are preferably prepared by the process of Transport Polymerization of intermediates, $Ar(-CX_2-e)_n$, under a vacuum with a low system-leakage-rate, or an inert atmosphere or both. Where X=H or preferably F. Ar is an aromatic diradical containing 6 to 30 carbons. e is a free radical having an unpaired electron. n is an integer of at least two, but less than the total available $sp^2C$ in the aromatic moiety, Ar. Note that these low k polymers only consist of $sp^2C$—X and $HC-sp^3C_\alpha$—X bonds, wherein X is H or F. $HC-sp^3C_\alpha$—X is designated for a hyper-conjugated $sp^3C$—X bond or for a single bond of X to a carbon that is bonded directly to an aromatic moiety. Due to hyper-conjugation, this C—X (X=H or F) has some double-double bond character, thus they are thermally stable for fabrications of future ICs.

The inert atmosphere is preferably devoid of free radical scavengers or compounds containing active hydrogen such as $H_2O$ and $NH_3$. In a specific embodiment, the intermediate has the general structure of $e-CX_2-Ar-X_2C-e$. Examples of the aromatic moiety, Ar, include, but are not limited to, the phenyl moiety, $C_6H_{4-n}F_n$ (n=0 to 4), including $C_6H_4$ and $C_6F_4$; the naphthenyl moiety, $C_{10}H_{6-n}F_n$ (n=0 to 6), including $C_{10}H_6$ and $C_{10}F_6$; the di-phenyl moiety, $C_{12}H_{8-n}F_n$ (n=0 to 8), including $C_6H_2F_2-C_6H_2F_2$ and $C_6F_4-C_6H_4$; the anthracenyl moiety, $C_{12}H_{8-n}F_n$ (n=0 to 8); the phenanthrenyl moiety, $C_{14}H_{8-n}F_n$ (n=0 to 8); the pyrenyl moiety, $C_{16}H_{8-n}F_n$ (n=0 to 8) and more complex combinations of the above moieties, including $C_{16}H_{10-n}F_n$ (n=0 to 10). Isomers of various fluorine substitutions on the aromatic moieties are also included.

In other preferred embodiments, the base vacuum is lower than 100 mTorrs, and preferably below 0.01 mTorrs, to avoid moisture inside deposition chamber. In further specific embodiments, the system leakage rate is less than about 2 mTorrs per minute, preferably less than 0.4 mTorrs/minute. In another preferred embodiment, the polymer film has a melting temperature ("$T_m$") greater than its reversible crystal transformation temperature ("$T_2$"), which is greater than its irreversible crystal transformation temperature ("$T_1$"), which is greater than its glass transition temperature ("$T_g$"). In an additional specific embodiment, the polymer film is a fluorinated or un-fluorinated PPX film having a general structure of $(-CX_2-C_6H_4-Z_n-X_2C-)_N$, where X=H or F, Z=H or F, n is an integer between 0 and 4, and N is the number of repeat units, greater than 10. Preferably, N is greater than 20 or 50 repeat units. In another embodiment, the PPX film is transparent and semicrystalline. In further specific embodiment, the PPX film is PPX-F, which has a repeating unit with the structure of $CF_2-C_6H_4-F_2C$.

Any material with low dielectric constant, such as a PPX film, has to possess several important attributes to be acceptable for integration into IC's.

First, the dielectric should be compositionally and dimensionally stable. The structural integrity should remain intact throughout the fabrication processes and after integration into the IC's. These processes include reactive ion etching ("RIE") or plasma patterning, stripping of photoresist, chemical vapor or physical vapor deposition ("CVD" or "PVD") of barrier and cap materials, electroplating and annealing of copper and chemical mechanical polishing ("CMP") of the copper. In addition, to maintain its electrical integrity after the IC fabrication, the dielectric should be free from contamination by barrier materials such as Ta.

In addition, the dielectric should not cause the structural or chemical breakdown of a barrier or cap layer. No corrosive organic elements, particularly any that would cause interfacial corrosion, should diffuse into the barrier or cap material. In addition, the dielectric should have sufficient dimensional stability so that interfacial stress resulting from a Coefficient of Thermal Expansion ("CTE")-mismatch between the dielectric and barrier or cap layer would not induce structural failure during and after the manufacturing of the IC's.

Finally, the interfaces of the dielectric and barrier or cap layers should be free from moisture, preventing the occurrence of ionic formation and/or migration when the IC's are operated under electrical bias.

The PPX films can be prepared by polymerization of their corresponding reactive diradical intermediates via transport polymerization. (Lee, J., Macromol, et al., Sci-Rev. Macromol. Chem., C16(1) (1977-78)). Examples of the PPX films and their repeat units resulting from polymerization of the diradical intermediates include commercially available products, such as: PPX-N ($-CH_2-C_6H_4-CH_2-$); PPX-F ($-CF_2-C_6H_4-CF_2-$); and perfluoro PPX ($-CF_2-C_6F_4-CF_2-$).

In general, diradical intermediates can be prepared from pyrolysis of corresponding dimers according to the Gorham method (U.S. Pat. No. 3,342,754). They can also be prepared by pyrolysis of monomers and co-monomers (see U.S. patent application "Integration of Low ϵ Thin Film and Ta Into Cu Dual Damascene," Ser. No. 09/795,217, the entire content of which is hereby incorporated by reference) under vacuum conditions or an inert atmosphere. The vacuum should be lower than about 100 mTorrs, preferably about 30 mTorrs. The vacuum system should also have an air or system leakage rate of less than about 2 mTorrs/minute, preferably lower than 0.4 mTorrs/minute. An inert atmosphere is an atmosphere that is devoid of free radical scavengers such as water and oxygen, or devoid of a compound containing "active hydrogen," such as an —OH, —SH, or —RNH group.

The resultant PPX products can be transparent or opaque films or in powder form depending on processing conditions. Only continuous films can be useful for IC manufacturing applications. Opaque films that contain micro-cracks or spherulites with crystal sizes even in sub-micrometer range are not useful in integrated circuits. Transparent films can be in an amorphous or semicrystalline PPX phase. When its crystalline phase is less than 10 nm or lower, semicrystalline PPX films can be useful for the manufacturing of future IC's. Amorphous PPX films consist of random polymer chain orientations, which will create equal interfacial stress in all directions, thus avoiding problems that are associated with semi-crystalline polymers. However, amorphous PPX films that consist of a regular chemical structure or repeating unit in their backbone structures can be re-crystallized into semicrystalline films. For example, these amorphous PPX films can transform into semicrystalline films when they are exposed to temperatures 20 to 30° C. above their glass transition temperature, $T_g$. Since re-crystallization will induce dimensional change and PPX-N and PPX-F have $T_g$'s of only about 65 and 172° C. respectively, the amorphous or low crystalline PPX-N and PPX-F are not useful for the manufacturing of future IC's.

Transparent semicrystalline PPX-N films have been obtained by controlling primarily the substrate temperature and chemical feed rate under a particular range of vacuum pressure in a deposition chamber. Detailed conditions and general mechanisms for making transparent semicrystalline PPX-N films have been described previously (Wunderlich et al., J. Polym. Sci. Polym. Phys. Ed., Vol. 11 (1973) and Wunderlich et al., J. Polym. Sci. Polym. Phys. Ed., Vol. 13

(1975)). The suitable vacuum range is about 1 to about 100 mTorrs, preferably about 5 to about 25 mTorrs. Under this vacuum range, the crystal form and crystallinity are result directly from the feed rate and substrate temperature. Suitable substrate temperatures can range from about −10 to about −80° C., preferably from about −25 to about −45° C. During IC fabrication, wafer temperature is controlled by the cooling of an electric chuck or a wafer holder using a coolant. A wafer temperature below about −45° C. is desirable for obtaining a high deposition rate, but it requires a special, expensive coolant such as fluorocarbon fluid or silicone oil.

It should be noted that at very low substrate temperatures, about −50 to −60° C., nucleation rates can be very high and hetero-epitaxial or highly oriented crystal growth is possible. The resulting polymer crystals would therefore be in "transcrystalline" or "columnar" forms. At these low temperature ranges, diradicals are absorbed very rapidly and the film growth rates are very high. However, this is achieved at the expense of the resulting crystallinity due to the entrapment of low molecular weight PPX-F units or other defects. A PPX-F film with low crystallinity can have poor dimensional stability at temperatures above its $T_g$, about 172° C. PPX-F films prepared under these conditions still need to be properly annealed before they can be useful for the manufacturing of future IC's. Thin films consisting of even more than few percent of low molecular weight PPX-F polymers are not useful due to the poor dimensional and chemical stability during the manufacturing of IC's.

Therefore, under the vacuum range of a few mTorrs and at substrate temperatures ranging from about −25 to about −45° C., desirable thin films with high crystallinity can be obtained by adjusting the feed rate of the precursors. Depending on the chemistries and precursors employed for the preparation, the feed rates can be very different. For example, at a feed rate from 1 to 10 standard cubic centimeters per minutes ("sccm") of the monomer Br—$CF_2$—$C_6H_4$—$CF_2$—Br and at a substrate temperature from about −30 to about −50° C., crystalline PPX-F films can be obtained. When the substrate temperature is higher than about 10° to 20° C., nucleation is difficult due to the low adsorption of diradical intermediates. However, under very high feed or flow 3 rates, polymer crystal growth can still be possible after an induction period to overcome primary nucleation on the substrate. PPX-F films prepared under these conditions can have high crystallinity. Even without annealing, these PPX-F films can be useful for integration into future IC's. Furthermore, it is possible to prepare a high temperature crystal form of PPX-F at substrate temperatures above 40-60° C., though the deposition rate will suffer enormously.

One should note that the above deposition processes inherently resulted in an as-deposited film with both chemical and dimensional instabilities that need further explanations as described in the following paragraphs.

Chemical Instability of as-deposited Films: In general, the dielectric films disclosed herein are formed in vacuum by step polymerization of many intermediate molecules or intermediates called diradicals. Each diradical carries an unpaired electron on both ends of the intermediate. We call the diradical as an intermediate, because it is very reactive toward another diradical. It has a lifetime in $10^{-6}$ second or less, when colliding at solid state with another diradical, even at temperatures as low as −100° C. We name reaction for polymer-chain extension as step polymerization because the polymerization reaction occurring one step a time.

Note that each diradical can grow from both ends of the intermediate, and after each step of the reaction, because the added polymer always leaves another unpaired electron at the polymer chain end. Thus, as polymer chain grows, each polymer-chain always bears two unpaired electrons at both ends of the polymer. This polymer chain is alive and can grow further as long as there is no scavenger is around or physically the chain-end is buried under other polymer chains that grow over the end. A compound that consists of X—H group or oxygen, herein X is nitrogen, Sulfur and oxygen, is very effective toward the unpaired electron, thus we call then scavengers, and it will stop the chain growth.

Since scavenger is absence under vacuum, the resulting The dielectric film can consist of living polymers or polymer with unpaired electron at polymer chain ends, because their chain ends are buried inside the films and still reactive toward scavengers. Note that most scavengers have smaller molecular size and can still diffuse to these chain ends. The resulting products that carrying —C=O or C—X (X—O, N, S) bonds, unfortunately, are very thermally unstable at high temperatures. These chemical groups decompose at temperatures from 250 to 400° C. in few minutes. In addition, presence of these unpaired electrons at polymer chain ends can result in poor electrical properties.

The above problems will pose a challenge to make chemically and electrically stable dielectric film, if the as-deposited film is exposed to air before these living chain ends are converted to some stable chemical groups. One solution for this problem is to anneal an as-deposited dielectric film with hydrogen under high temperature before the film is removed from deposition chamber or vacuum system. This annealing process can achieve both high crystallinity for better dimensional stability and chemical stability by capping all unpaired chain ends with C—H bond, which is more stable than C—C or C—O bonds.

Dimensional Instability of as-deposited Films: One of the important requirements for the dielectric film is to achieve good adhesion to the barrier layer, etch stop layer and the cap layer. Scientifically speaking, adhesion strength can be examined by looking into its chemical and physical contributors Good physical or mechanical adhesion calls for good mechanical interlocks with larger contacting surfaces. In addition, to achieve good mechanical interlocking, the dimensional stability of the interlocking faces has to be stable in view of their relative dimensional expansion under temperature incursion. Since all inorganic layers used in IC fabrications have lower Coefficient of Thermal Expansion ("CTE") than polymer dielectric, it is thus desirable to lower the CTE of the polymer dielectric by either increase their cross-linking density or increase their crystallinity.

Dimensional stability of an as-deposited film may be achieved 1) by controlling the deposition conditions, such as feed rate and substrate temperature to obtain a thermally more stable crystal form, and 2) by post-annealing treatment of an as-deposited film to increase its crystallinity. The details for both the processing conditions and the post annealing methods are described in the following paragraphs.

II. Methods for Making Dimensionally Stable Films:

Without proper processing conditions, high crystalline PPX films obtained through re-crystallization will fail when subjected to fabrication processes currently employed for making IC's. In the IC's that use electrically plated copper as a conductor, the required annealing temperature for the copper ranges from 300° C. for one hour to 350° C. for 30 minutes. Some integration processes also require a substrate temperature of 400° C. In addition, during packaging operations of the IC's, such as wire bonding or solder reflow, structural stability of the dielectric at temperatures as high as 300 to 350° C. is also required. Therefore, any useful PPX film needs to be chemical and dimensionally stable at temperatures up to 300 to 350° C., preferably 350 to 400° C. for at least 30 minutes.

DSC measurements, performed at a 10 to 15° C. per minute heating rate and under a nitrogen atmosphere, show a peak $T_g$ for PPX-F around 170° C. and an Alpha to Beta-1 irreversible crystal transformation temperature, ("ICT"), ranging from 200° to 290° C. with a peak temperature, $T_1$, around 280° C. In addition, there are also a Beta-1 to Beta-2 reversible crystal transformation temperature ("RCT"), ranging from 350 to 400° C. with a peak $T_2$ around 396° C. and a melting temperature, $T_m$, ranging from 495 to 512° C. with a peak $T_m$ around 500° C. For comparison, the corresponding $T_g$, $T_1$, $T_2$, and $T_m$ for PPX-N are respectively, 65°, 230°, 292° and 430° C. (Wunderlich et al., J. Polym. Sci. Polym. Phys. Ed., Vol. 11 (1973) and Wunderlich et al., J. Polym. Sci. Polym. Phys. Ed., Vol. 13 (1975)). The Alpha to Beta-1 crystal transformation occurring at $T_1$ is irreversible, while the Beta-1 to Beta-2 crystal transformation, at $T_2$, is reversible for both PPX-N and PPX-F. When a crystalline PPX-N or PPX-F film is exposed to temperatures approaching its $T_1$, polymer chains in its Alpha crystalline phase will start to reorganize and transform into a more thermally stable Beta-1 crystal phase. Once this happens, the film will never show its Alpha phase again, even by cooling the film below its $T_1$. However, if a PPX-N or PPX-F film is cooled slowly from at or above its $T_2$ to a temperature below its $T_2$, the less dimensionally stable Beta-1 crystal phase will reform.

One way to maximize the dimensional stability of the PPX-N or PPX-F film is to trap the polymer chains in their most thermally stable form, the Beta-2 crystal phase, if the film is to be used or exposed to temperatures approaching $T_2$. Then, if the film is exposed to temperatures approaching or surpassing its $T_2$, crystal transformation cannot occur, because the film is already in its Beta-2 form. Eliminating this phase transformation ensures the dimensional stability of the film. In principle, when the film is in its Beta-2 crystal phase, its dimensional stability is still assured even at temperatures approaching 50 to 60° C. below its $T_m$. A highly crystalline (greater than 50% crystallinity) PPX-F film in a Beta-2 crystal phase can be dimensionally stable up to 450° C. for at least 30 minutes, limited only by its chemical stability.

A polymer film that exhibit a reversible crystal transformation temperature, $T_2$, and a crystal melting temperature, $T_m$ can be obtained by optimizing the feed rate and substrate temperature during film deposition. By controlling the feed rate and substrate temperatures, semicrystalline films consisting of either Alpha or Beta phase crystals have been prepared (Wunderlich et al., J. Polym. Sci. Polym. Phys. Ed., Vol. 11 (1973) and Wunderlich et al., J. Polym. Sci. Polym. Phys. Ed., Vol. 13 (1975)). When the substrate temperature is lower than the melting temperature of its intermediate diradical, Tdm, and when the feed rate is low (less than 0.07 g/minute), the polymerization of crystalline diradicals can result in PPX-N films that are predominantly in the Beta crystal phase and have high crystallinity. Conversely, when the substrate temperature is higher than the Tdm, polymerization of liquid diradicals and subsequent crystallization of polymers often results in PPX-N films that are in the Alpha crystal phase and have low crystallinity.

The above film on wafer is generally referred as an "as-deposited film." Before it is removed from the deposition system and when it is still under the vacuum condition, the as-deposited film may need to be further stabilized in order to achieve sufficient chemical and dimensional stability for use in integrated circuits.

Accordingly, a stabilized film can be obtained by annealing the as-deposited film to a temperature approaching to or above its $T_2$ and under the presence of hydrogen and then quickly quenching the films to at least 30 to 60° C. below their $T_2$. For instance, a PPX-F film that is predominantly in the Beta-2 crystal phase can be obtained by heating the film to 450° C. for 5 minutes, then quenching the film to 330° C. at a cooling rate of approximately 1° C./second or faster. When the post annealing was performed under 3 to 20% hydrogen conditions, the resulting films also exhibited very low leakage current comparing to the as-deposited film and an annealed film that was obtained under vacuum conditions. Other cooling rates may also be suitable, including but not limited to rates between approximately 1° C./second and 15° C./second, or even faster. Alternatively, slower cooling rates may also be used for some films. For example, it has been determined that a significant amount of beta-2 phase in can be preserved in PPX-F by using a cooling rate of approximately 50° C./minute.

Actual polymer chain motions for solid state transition or phase transformation can start from 30 to 60° C. below the corresponding $T_g$, $T_1$, $T_2$ and $T_m$ depending on the history of the films, degree of crystallinity, perfection of crystals, or the existence of various low molecular weight material in the crystalline phase (Wunderlich, Macromolecular Physics, Vol. 1-2 (1976). In fact, the Beta-1 to Beta-2 transition can start at temperatures ranging from 40 to 50° C. below $T_2$, (about 396° C.) for PPX-F films. Therefore, by exposing a deposited PPX-F film to 350° C. for one hour, the quenched PPX-F film also exhibited a high content of Beta-2 phase crystallinity. The presence of Beta-2 crystals can be verified by DSC. When a PPX-F film containing a high percentage of Beta-2 phase crystals was scanned by DSC from 25 to 510° C. under a nitrogen atmosphere, only $T_m$ was observed and not $T_1$ or $T_2$.

The maximum temperature, $T_{max}$, which is encountered during the manufacturing of IC's, will undoubtedly be lowered over time due to technological advancements. Improvements in copper plating chemistries and the perfection of the resulting copper films will lower the required annealing temperatures. In addition, physical vapor deposition temperatures for barrier layers or cap layers could be reduced to temperatures below 400° C. Once this occurs, the maximum processing temperature, $T_{max}$, can be lowered to temperatures below 350° C., possibly as low as 325° to 300° C. In that case, the annealing of PPX-F films can be performed at temperatures 30 to 50° C. below $T_2$ (396° C. for PPX-F) or as low as temperatures 10 to 20° C. above $T_1$ (280° C. for PPX-F). However, the annealing should be done at a temperature equal to or higher than the $T_{max}$ for 1 to 60 minutes and preferably for 3 to 5 minutes.

Note that all the above post annealing should be conducted before an as-deposited film is removed from the deposition systems and is conducted in the presence of hydrogen. Preferably, the reductive annealing is conducted not inside the deposition chamber but inside a post treatment chamber. The reductive annealing is conducted under an atmosphere consisting of 0.1 to 100, preferably 3 to 6% of H in argon and at high temperatures conditions described in the above.

III. Methods for Stabilizing Films after Plasma Etching:

During fabrication of future IC's, a stabilized film obtained from the above will subject to further process as follows: First, a photoresist is spun onto a substrate and patterned using a photo mask and UV irradiation. After removal of unexposed photoresist, a via pattern of photoresist over the underlying dielectric, a via in the dielectric layer is formed by plasma etching of the dielectric that is not protected by the photoresist. A thin layer (100 to 200 Å) of barrier metal such as Ta is then deposited using a physical vapor deposition ("PVD") method. Optionally, a cap-layer is deposited over the dielectric before coating of photoresist and photolithographic pattering of the dielectric. The cap-layer is used to protect the dielectric from mechnical damage during CMP.

The low k films that consist primarily of C, H and F and single bonds of $sp^2C$—F and HC-$sp^3C$—F types can utilize oxidative plasma to achieve high etching rate vs. that of photoresist. Under treatment under 0.02 W/cm$^2$ to 2.0 W/cm$^2$, preferably 0.04 W/cm$^2$ to 1.0 W/cm$^2$ of discharge power and under 20 to 2000, preferably 50 to 500 mTorrs of oxygen pressure, an etching rate ranging from 500 to 5000 Å/minute can be obtained. However, after more than few Angstroms of polymers were removed from the film surface, the composition of the resulting surface became highly oxidized. The freshly etched polymer surfaces are NOT suitable for fabrication of IC's, because they consist of thermally unstable oxygenated carbon groups, such as —CX—O, —XC=O, —CX—O—O—X and —(C=O)—OX bonds (X=H or F). These oxygenated carbon bonds will decompose at temperatures above 200 to 350° C. In addition, these types of oxidized surfaces tend to adsorb moisture and form hydrogen bonded water on their surfaces. Thus, if a barrier metal, cap layer or etch stop layer is deposited over the oxidative plasma treated surface, loss of adhesion can easily happen after the coating process or during subsequent processes.

In addition, patterning of the dielectric films disclosed herein has also been performed by dry etching using nitrogen plasma. For instance, nitrogen plasma patterning can be done using 30 W of plasma power under 900 mTorrs of pressure. The resultant film surfaces were found unsuitable for obtaining good adhesion. We suspect that some nitrogen were chemically reacted with the C—X (X=H or F) of the dielectric surfaces and converted to unstable —C—N or polar —C=N— bonds both are desirable for IC fabrication applications.

A method to re-stabilize the reactive plasma etched treated polymer surfaces that is obtained from the oxygen or nitrogen plasma etching, for further coating includes reductive annealing the surfaces under hydrogen atmosphere at high temperatures. Alternatively, by treating the oxidized surfaces first using non-reactive plasma then followed with a reductive annealing at high temperatures. The non-reactive plasma for instance can be conducted under the presence of argon gas. The non-reactive plasma is believed, in addition to remove some of the oxygenated or nitrogen-reacted carbon groups on surfaces, also to roughen these surfaces for better mechanical adhesion during the subsequent coating. The reductive annealing under high temperature is primarily used to reduce the $sp^2C$—Y and HC-$sp^3C$—Y (Y=O or N) groups back to $sp^2C$—X and HC-$sp^3C_\alpha$—X. Herein, X is F, or preferably H. Note that the above methods will result in thermally stable $sp^2C$—X and HC-$sp^3C_\alpha$—X bonds (X=H or F) that are thermally stable for fabrications of future IC's.

Note that the above re-stabilization methods are not useful if the original low k films consist of other unstable chemical bonds, such as $sp^3C$—X bonds (X=H or F). These polymers consist of regular tetrahedron $sp^3C$—X bonds, such as —$CX^3$ and —$CX_2$— bonds (X=H or F) that its carbon is not an Alpha carbon to an aromatic moiety. These $sp^3C$—X bonds-containing polymers are not stable enough for fabrications of future IC's that require a minimum thermal stability at temperatures of 350° C. or higher for 30 minutes or longer. Therefore, even their after-oxidative-plasma-etched surfaces are treated with the methods described herein, the thermal stability of their resulting polymers will NOT be improved beyond the thermal stability of the original polymers, thus will still not useful for fabrication of future IC's.

The reductive annealing can be conducted under an atmosphere of 1 to 30%, preferably 3 to 10% of hydrogen in argon or other noble gases and at 410 to 450° C. for 2 to 60, preferably from 3 to 10 minutes. The non-reactive plasma treatment can be conducted under treatment under 0.01 W/cm$^2$ to 1.0 W/cm$^2$, preferably 0.04 W/cm$^2$ to 0.4 W/cm$^2$ of discharge power and under 20 to 2000, preferably 50 to 500 mTorrs of argon pressure.

Alternatively, the dry etching by plasma partnering of a polymer film can be conducted in the presence of an reductive gas composition, for instance, from 20 to 2000, preferably 100 to 1000 mTorrs of 3 to 10% of hydrogen in argon or other noble gases and under 0.01 W/cm$^2$ to 1.0 W/cm$^2$, preferably 0.04 W/cm$^2$ to 0.4 W/cm$^2$ of discharge power.

IV. Experiments and Results:

The following are offered by way of example, and are not intended to limit the scope of the invention in any manner.

Experiment 1: Deposition of PPX-F was performed using a system that consisted of a quartz reactor with porous SiC inserts that were heated to a temperature of about 580° C. by an infrared heater. The precursor is $YCX_2$—$C_6H_{4-n}Z_n$—$X_2CY$, where X=F, n=0 and Y=—Br. It was heated in a sample holder at 65° C. to achieve a feed rate of at least 0.1 mMol/minute and transported to the reactor under a system vacuum of about 20 mTorrs. The reacted precursors or diradical intermediates were transported to a 200-mm wafer that was kept at −35° C. using an electrical static chuck ("ESC"). The film thickness is about 3483 Å (Low $W^c B_2$).

Experiment 1A: The resulting film from the Experiment 1 was analyzed using X-ray diffraction ("XRD"). The film has a diffraction angle, 2θ at 19.2 degree with relative peak intensity of 520, indicative of Beta 2 crystals in the film that has low crystallinity ("$W^c$"). After the film was annealed on hot plate at 350° C. for 10 minutes, only peak intensity changes to about 800. After the film was annealed on hot plate at 390° C. for 10 minutes, its peak intensity changes to about 870. After the film was annealed on hot plate at 405° C. for 10 minutes, its peak intensity changes to about 1000. After the film was annealed on hot plate at 405° C. for 60 minutes and slowly cooled to 25° C., its diffraction angle, 2θ shifted to 20.3 degree with a relative peak intensity of 6000, indicative of Beta 1 crystals in the film that has very high crystallinity.

Experiment 1B: The film obtained from the Experiment 1 was annealed on hot plate at 410° C. for 30 minutes and slowly cooled to 25° C., its diffraction angle, 2θ shifted to 20.3 degree with a relative peak intensity of 6000, indicative of Beta 1 crystals in the film that has high crystallinity.

Experiment 1C: The film obtained from Experiment 1 was annealed on hot plate at 405° C. for 60 minutes and slowly cooled to 25° C., the XRD showed it consisted of Beta 1 crystal with high crystallinity. The film on silicon wafer was coated with a 200 Å of Ta using PVD process. The sample was annealed at 350° C. for 30 minutes. The resulting sample showed no breakage of Ta. Rutherford Backscattering Spectroscopy ("RBS") analysis of the profile showed Ta did not diffused into polymer, and the organic elements did not diffused inside the Ta.

Experiment 1D: The film obtained from the Experiment 1 was annealed on hot plate at 300° C. for 30 minutes, only peak intensity changes to about 500 ($B_2$). After the film was annealed on hot plate at 450° C. for 30 minutes and quickly quenched to room temperature, the film still showed a diffraction angle, 2θ at 19.2 degree with a peak intensity changes to about 3000, indicative of Beta 2 crystal in the film with high crystallinity. The film on silicon wafer was coated with a 200 Å of Ta using PVD process. The sample was annealed at 350° C. for 30 minutes. The resulting sample showed no breakage of Ta. Rutherford Backscattering Spectroscopy ("RBS") analysis of the profile showed no Ta diffused into polymer, nor organic elements diffused inside the Ta.

In summary, the above experiments indicated that high crystalline Beta 1 and Beta 2 are stable, when Ta is used as barrier layer and the annealing condition is no more than 350° C. for 30 minutes. However, if a prolong annealing time or a higher temperature is required, it is preferred to use a PPX-F film that consisted of highly crystalline Beta 2 crystal phase, because it is more dimensionally stable than the Beta 1 crystals.

Experiment 2: The film obtained from Experiment 1 (Low $W^c$ $B_2$) was heated to 350° C. at a 15° C./minute heating rate, held isothermally at about 350° C. for 30 minutes under $10^{-7}$ vacuum, then quenched at 60° C./minute to room temperature. The resulting film is about 3472 Å (Med $W^c$ $B_2$).

Experiment 3: The film obtained from Experiment 1 (Low $W^c$ $B_2$) was heated to 410° C. at a 15° C./minute heating rate, held isothermally at about 410° C. for 30 minutes under $10^{-7}$ vacuum, then quenched at 60° C./minute to room temperature. The resulting film is about 3395 Å (Hi $W^c$ $B_2$).

Experiment 4: The film obtained from Experiment 1 (Low $W^c$ $B_2$) was heated to 400° C. at a 15° C./minute heating rate, held isothermally at about 400° C. for 60 minutes nitrogen atmosphere, then slowly cooled to room temperature (Hi $W^c$ $B_1$).

Experiment 5: The film obtained from Experiment 1 (Low $W^c$ $B_2$) was coated with a 250 Å of Ta using PVD process. Peel test using a 3M Scotch® tape showed adhesion failure at Si wafer interface. After the sample was annealed at 350° C. for 30 minutes under $10^{-7}$ vacuum, the sample Ta was heavily corroded and cracked with dielectric film.

Experiment 6: The film obtained from Experiment 2 (Med $W^c$ $B_2$) was coated with a 250 Å of Ta using PVD process. Peel test using a 3M Scotch® tape showed no adhesion failure. However, after the sample was annealed at 350° C. for 30 under $10^{-7}$ vacuum, the sample failed at dielectric and Si-wafer interface when subjected to peeling test using 3M scotch tape. In addition, Ta showed slightly cracking.

Experiment 7: The film obtained from Experiment 3 (Hi $W^c$ $B_2$) was coated with a 250 Å of Ta using PVD process. Peel test using a 3M Scotch® tape showed no adhesion failure. However, after the sample was annealed at 350° C. for 30 under $10^{-7}$ vacuum, the sample failed at dielectric and Si-wafer interface when subjected to peeling test using 3M scotch tape. In addition, Ta showed slightly cracking.

Experiment 8a: The film obtained from Experiment 4 (Hi $W^c$ $B_1$) was coated with a 250 Å of Ta using PVD process. Peel test using a 3M Scotch® tape showed no adhesion failure. After the sample was annealed at 350° C. for 30 minutes under $10^{-7}$ vacuum, Ta showed slightly sign of corrosions. When subjected to peeling test using a 3M scotch tape, the sample showed no adhesion failure.

Experiment 8b: The film obtained from Experiment 4 (Hi-$W^c$ $B_1$) was further heated to 410° C. at a 15° C./minute heating rate, held isothermally at about 410° C. for 30 minutes under $10^{-7}$ vacuum, then quenched at 60° C./minute to room temperature (Maxi-$W^c B_2$). The sample was coated with a 250 Å of Ta using PVD process. Peel test using a 3M Scotch® tape showed no adhesion failure. After the sample was annealed at 350° C. for 30 minutes under $10^{-7}$ vacuum, Ta showed no sign of corrosions. When subjected to peeling test using a 3M Scotch® tape, the sample showed no adhesion failure.

Experiment 9: The film obtained from Experiment 4 (Hi-$W^c$ $B_1$) was etched at 50 Watts of power and under 50 mTorrs of oxygen plasma to remove 400 Å of polymer films. The film was then coated with a 250 Å of Ta using PVD process. The samples passed a peeling test using a 3M Scotch® tape. After the sample was annealed at 350° C. for 30 minutes under $10^{-7}$ vacuum, the Ta only showed spotty corrosions at the edge of test specimens. When subjected to peeling test using a 3M Scotch® tape, the sample peeled off 50% at low k and Ta interface.

Experiment 10: The film obtained from Experiment 4 (Hi-$W^c$ $B_1$) was etched at 50 Watts of power and under 50 mTorrs of oxygen plasma to remove 400 Å of polymer films. The film was annealed under $10^{-7}$ Torrs of vacuum and at 410° C. for 30 minutes and then quenched to room temperature (Maxi $W^c$ $B_2$). The film was then coated with a 250 Å of Ta using PVD process. The samples passed a peeling test using a 3M scotch tape. After the sample was annealed at 350° C. for 30 minutes under $10^{-7}$ vacuum, Ta only showed spotty corrosions at the edge of test specimens. When subjected to peeling test using a 3M Scotch® tape, the sample peeled 10% at low k and Ta interface.

Experiment 11: The film obtained from Experiment 4 (Hi $W^c$ $B_1$) was annealed under $10^{-7}$ Torrs of vacuum and at 410° C. for 30 minutes and then quenched to room temperature (Maxi $W^c$ $B_2$). Then it was etched at 50 Watts of power and under 50 mTorrs of oxygen plasma to remove 400 Å of polymer films. The film was then coated with a 250 Å of Ta using PVD process. The samples passed a peeling test using a 3M Scotch® tape. After the sample was annealed at 350° C. for 30 minutes under $10^{-7}$ vacuum, Ta only showed spotty corrosions at the edge of test specimens. When subjected to peeling test using a 3M Scotch®tape, the sample failed adhesion at low k and Ta interface.

Experiment 12: The film obtained from Experiment 4 (Hi $W^c$ $B_1$) was annealed under $10^{-7}$ Torrs of vacuum and at 410° C. for 30 minutes and then quenched to room temperature (Maxi $W^c$ $B_2$). Then it was etched at 50 Watts of power and under 50 mTorrs of oxygen plasma to remove 400 Å of polymer films. The film was annealed under $10^{-7}$ Torrs of vacuum and at 410° C. for 30 minutes and quenched to 25° C. (Maxi $W^c$ $B_2$). The film was then coated with a 250 Å of Ta using PVD process. The samples passed a peeling test using a 3M Scotch® tape. After the sample was annealed at 350° C. for 30 minutes under $10^{-7}$ vacuum, Ta only showed spotty corrosions at the edge of test specimens. When subjected to peeling test using a 3M Scotch® tape, the sample failed adhesion at low k and Ta interface.

Experiment 13: The film obtained from Experiment 4 (Hi $W^c$ $B_1$) was annealed under $10^{-7}$ Torrs of vacuum and at 410° C. for 30 minutes and then quenched to room temperature (Maxi $W^c$ $B_2$). Then it was etched at 50 Watts of power and under 50 mTorrs of oxygen plasma to remove 400 Å of polymer films. The film was annealed then under 3% $H_2$ in argon at 410° C. for 30 minutes (Maxi $W^c B_2$). The film was then coated with a 250 Å of Ta using PVD process. The sample was then annealed at 350° C. for 30 minutes under $10^{-7}$ vacuum. The sample failed adhesion at low k and Si-wafer interface when subjected to peeling test using a 3M Scotch® tape.

Experiment 14: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of polymer films. The film then was treated at 30-Watts power with 900 mTorrs of $N_2$ plasma. The film was then coated with a 250 Å of Ta using PVD process. The sample was then annealed at 350° C. for 30 minutes under $10^{-7}$ vacuum. The sample failed adhesion at low k and Ta interface when subjected to peeling test using a 3M Scotch® tape.

Experiment 15: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of polymer films. The film then was treated at 30 Watts of discharge power and 900 mTorrs of $N_2$ plasma. Then, the film was annealed under 3% $H_2$ in argon at 410° C. for 30 minutes and then quenched to room temperature (Maxi $W^c B_2$). The film was then coated with a 250 Å of Ta using PVD process. The sample was then annealed at 350° C. for 30 minutes under $10^{-7}$ vacuum. The sample failed adhesion at low k and Si-wafer interface when subjected to peeling test using a 3M Scotch® tape.

Experiment 16: The film obtained from Experiment 4 (Hi $W^c B_1$) was etched at 50 Watts of discharge power and under 50 mTorrs of oxygen plasma to remove 400 Å of polymer films. The film then was treated at 30 Watts of discharge power and 900 mTorrs of $N_2$ plasma. The film was then coated with a 250 Å of Ta using PVD process. The sample was then annealed at 350° C. for 30 minutes under $10^{-7}$ vacuum. The sample partially peeled at low k and Ta interface when subjected to peeling test using a 3M Scotch® tape.

Experiment 17: The film obtained from Experiment 4 (Hi $W^c B_1$) was etched at 50 Watts of power and under 50 mTorrs of oxygen plasma to remove 400 Å of polymer films. The film was annealed under 3% $H_2$ in argon at 410° C. for 30 minutes and then quenched to room temperature (Maxi $W^c B_2$). The film was then coated with a 250 Å of Ta using PVD process. The sample was then annealed at 350° C. for 30 minutes under $10^{-7}$ vacuum. The sample was partially peeled at low k and Ta interface when subjected to peeling test using a 3M Scotch® tape.

Experiment 18: The film obtained from Experiment 4 (Hi $W^c B_1$) was etched at 50 Watts of power and under 50 mTorrs of oxygen plasma to remove 400 Å of polymer films. The film then was treated at 30 Watts of discharge power and 900 mTorrs of $N_2$ plasma. The film was then annealed under 3% $H_2$ in argon at 410° C. for 30 minutes. The film was then coated with a 250 Å of Ta using PVD process. The sample was then annealed at 350° C. for 30 minutes under $10^{-7}$ vacuum. The sample showed NO peeling when subjected to peeling test using a 3M Scotch® tape.

The results obtained from the above Experiments 2 to 18 are summarized in the followings:

1. A higher temperature (>/=) 410° C. annealing to maximize crystallinity would prevent film structure change and adhesion failure during 350° C. annealing (Expts. 8b).

2. Due to decomposition of oxygenated chemical bonds at interfaces, all oxidized surfaces failed to retain good adhesion between Ta to dielectric during a subsequent annealing at high temperature (>/=350° C./0.5 hr) (Expts. 9 to 12).

3. Non-oxidative plasma increased surface roughness and increased adhesion of Ta to dielectric.

4. $N_2$ plasma roughened the dielectric surfaces, but also caused the changes of C—X (X=F) bonds to C—Y (Y=N) bonds, thus did not provide good adhesion between Ta and dielectric when exposed to high temperatures.

5. Reductive annealing at high temperatures for oxidized dielectric surfaces reduced oxidized carbon bonds back to $sp^2C$—X and HC-$sp^3C_\alpha$—X bonds (X=H or F) and thermally stabilized the dielectric surfaces for further coatings.

6. Best adhesion can be obtained by combining a roughening of film surfaces using argon or argon/H plasma and reductive annealing of the oxidized at high temperature (Expt. 18), or an reductive annealing alone.

7. High crystalline $B_2$ crystal form of PPX-F seemed to degrade at Si and dielectric interfaces during reactive plasma etching of PPX-F more than high crystalline $B_1$ (Expts. 15 vs. 18).

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications, and variations as falling within the true scope and spirit of the present invention.

REFERENCES CITED

The following U.S. Patent Documents and publications are incorporated by reference herein.

U.S. Patent Documents

U.S. Pat. No. 3,342,754 issued in September of 1967 with Gorham listed as an inventor.

U.S. Pat. No. 6,302,874 issued in October of 2001 with Zhang et al. listed as an inventor.

U.S. Pat. No. 6,703,462 issued in March 2004 with Lee listed as an inventor.

U.S. Pat. No. 6,797,343 issued in September 2004 with Lee listed as inventor.

U.S. Pat. No. 6,825,303 issued in November of 2004 with Lee listed as an inventor.

U.S. patent application Ser. No. 10/029,373, filed Dec. 17, 2001.

OTHER REFERENCES

Brun A. E. 100 nm: The Undiscovered Country, Semiconductor International, p79, February 2000.

Chung Lee, "Transport Polymerization of Gaseous Intermediates and Polymer Crystals Growth" J. Macromol. Sci-Rev. Macromol. Chem., C16 (1), 79-127 (1977-78), pp79-127).

Geissman T. A. Principles of Organic Chemistry, 3rd edition, W. H. Freeman & Company, p275.

Kudo et al., Proc. 3d Int. DUMIC Conference, 85-92 1997.

LaBelle et al., Proc, 3d Int. DUMIC Conference, 98-105 1997.

Lee, J., et al. Macromol Sci-Rev. Macromol. Chem., C16(1) 1977-78.

Lu et al, J. Mater. Res. Vol, 14(1), p246-250, 1999; Plano et al, MRS Symp. Proc. Vol. 476, p213-218, 1998.

Selbrede, et al., Characterization of Parylene-N Thin Films for Low Dielectric Constant VLSI Applications, Feb. 10-11, 1997, DUMIC Conference, 1997 ISMIC—222D/97/0034, 121-124.

Wang, et al., Parylene-N Thermal Stability Increase by oxygen Reduction-Low Substrate Temperature Deposition, Preannealing, and PETEOS Encapsulation, Feb. 10-11, 1997, DUMIC Conference, 1997 ISMIC-222D/97/0034, 125-128.

Wary, et al., Polymer Developed to be Interlayer Dielectric, Semi-Conductor International, 211-216, June 1996.

Wunderlich et al, Jour. Polymer. Sci. Polymer. Phys. Ed., Vol. 11, (1973), pp 2403-2411; ibid, Vol. 13, (1975), pp1925-1938.

Wunderlich et al., J. Polym. Sci. Polym. Phys. Ed., Vol. 13 1975.

Wunderlich, Macromolecular Physics, Vol. 1-2, 1976.

What is claimed is:

1. A method of stabilizing a poly(paraxylylene) dielectric thin film after forming the dielectric thin film via transport polymerization, the method comprising:
    annealing the dielectric thin film under at least one of a reductive atmosphere and a vacuum at a temperature above a beta-1 to beta-2 phase transition temperature of the dielectric film; and
    cooling the dielectric thin film at a rate of 60° C./min or faster to a temperature below the beta-1 to beta-2 phase transition temperature of the dielectric thin film.

2. The method of claim 1, wherein annealing the dielectric film includes annealing the dielectric film in a presence of hydrogen.

3. The method of claim 2, wherein the dielectric film is annealed in a mixture of 20% or less hydrogen in the presence of an inert gas.

4. The method of claim 3, wherein the inert gas is argon.

5. The method of claim 1, wherein the dielectric film has a repeat unit of —$CF_2C_6H_4CF_2$—.

6. The method of claim 1, wherein the dielectric film is annealed for a time in a range between approximately 1 and 120 minutes.

7. The method of claim 6, wherein the dielectric film is annealed for a time in a range between 3 and 5 minutes on hot plate.

8. The method of claim 7, wherein the dielectric film is annealed at a higher temperature than a maximum processing temperature used in later integrated circuit processing steps.

9. The method of claim 1, wherein the reductive atmosphere includes a mixture of a reductive gas and an inert gas, and wherein the reductive gas has a concentration in the mixture of less than or equal to 20% by volume in the inert gas.

10. A method of stabilizing a poly(paraxylylene). dielectric thin film after forming the dielectric thin film via transport polymerization, the method comprising:
    annealing the dielectric thin film under at least one of a reductive atmosphere and a vacuum at a temperature above a reversible solid phase transition temperature of the dielectric film to convert the film from a lower temperature phase to a higher temperature phase, wherein the solid phase transition temperature is higher than a glass transition temperature and lower than a melting temperature; and
    cooling the dielectric thin film at a sufficient rate to a temperature below the solid phase transition temperature of the dielectric thin film to trap substantial portions of the film in the higher temperature phase.

11. The method of claim 10, wherein the poly(paraxylylene) dielectric thin film has a repeat unit of —$CF_2C_6H_4CF_2$—.

12. The method of claim 10, wherein annealing the dielectric film under a reductive atmosphere includes annealing the dielectric film in a presence of hydrogen.

13. The method of claim 12, wherein the dielectric film is annealed in a mixture of 20% or less hydrogen in the presence of an inert gas.

14. The method of claim 13, wherein the inert gas is argon.

15. The method of claim 10, wherein the dielectric film is annealed for a time between approximately 1 and 120 minutes.

16. The method of claim 10, wherein the dielectric film is annealed for a time between approximately 3 and 5 minutes on hot plate.

17. The method of claim 10, wherein the dielectric film is annealed at a higher temperature than a maximum processing temperature used in later integrated circuit processing steps.

18. The method of claim 10, wherein the solid phase transition is a beta-1 to beta-2 phase transition.

19. The method of claim 10, wherein the film is cooled at a rate of at least 1° C./second.

20. The method of claim 10, wherein the film is cooled at a rate of between 1° C./second and 5° C./second.

* * * * *